United States Patent
Hayashi et al.

(10) Patent No.: US 7,287,920 B2
(45) Date of Patent: Oct. 30, 2007

(54) SEMICONDUCTOR MANUFACTURING APPARATUS AND METHOD

(75) Inventors: Shinichi Hayashi, Koshi-machi (JP); Tsunenaga Nakashima, Koshi-machi (JP); Suguru Enokida, Koshi-machi (JP); Masami Akimoto, Koshi-machi (JP); Nobuaki Matsuoka, Koshi-machi (JP)

(73) Assignee: Tokyo Electron Limited, Tokyo (JP)

( * ) Notice: Subject to any disclaimer, the term of this patent is extended or adjusted under 35 U.S.C. 154(b) by 74 days.

(21) Appl. No.: 11/354,987

(22) Filed: Feb. 16, 2006

(65) Prior Publication Data
US 2006/0194445 A1 Aug. 31, 2006

(30) Foreign Application Priority Data
Feb. 17, 2005 (JP) ............................ 2005-040994

(51) Int. Cl.
*G03D 5/00* (2006.01)
(52) U.S. Cl. ........................................ 396/611; 414/935

(58) Field of Classification Search .................. 396/611
See application file for complete search history.

(56) References Cited

FOREIGN PATENT DOCUMENTS

JP 3337677 8/2002

*Primary Examiner*—D. Rutledge
(74) *Attorney, Agent, or Firm*—Oblon, Spivak, McClelland, Maier & Neustadt, P.C.

(57) ABSTRACT

A semiconductor manufacturing apparatus includes a transfer mechanism including a moving part for holding a substrate to be processed and moving along a longitudinal transferring passage and a plurality of processing units for performing respective processes on the substrate. The processing units are disposed along the transferring passage and the substrate is transferred between the processing units and the transfer mechanism. An exhaust chamber is provided under the processing units, the exhaust chamber having a gas exhaust opening at the side of the transferring passage, the exhaust chamber. Further, a suction exhaust line is connected to the exhaust chamber, and a guide member is provided inside the exhaust chamber or at a position facing the opening, wherein the guide member extends along the transferring passage.

13 Claims, 12 Drawing Sheets

SEMICONDUCTOR MANUFACTURING APPARATUS AND METHOD

FIELD OF THE INVENTION

The present invention relates to a semiconductor manufacturing apparatus and method for transferring a substrate such as a semiconductor wafer or the like under, e.g., a positive pressure controlled atmosphere.

BACKGROUND OF THE INVENTION

In general, a series of processes for forming a resist pattern on a substrate such as a semiconductor wafer (hereinafter, referred to as 'wafer') is performed by using a semiconductor manufacturing apparatus in which an exposure device is connected via an interface block to a coating/developing device for coating and developing resist liquid.

Meanwhile, a recent trend towards a faster throughput of the exposure device requires an enhanced processing capability of the coating/developing device matching with the faster throughput capability of the exposure device. As for a semiconductor manufacturing apparatus having a coating/developing device of an improved processing capability, for example, Japanese Patent No. 3337677 discloses a semiconductor manufacturing apparatus in which blocks for respectively accommodating therein modules before and modules after an exposure processing are vertically arranged to form the coating/developing device, each block being connected to an exposure device via an interface port. In the coating/developing device, each of the blocks has a longitudinal transferring passage through which a wafer is transferred, and along the transferring passage, a plurality of coating units are provided to face a plurality of thermal processing units, having the transferring passageway therebetween. Further, a transfer mechanism moving along the transferring passage transfers the wafer between the processing units. In a thus configured coating/developing device, the coating process and the developing process are separately performed and, therefore, a wafer transfer efficiency is enhanced, resulting in an improved wafer processing capability.

However, in the semiconductor manufacturing apparatus disclosed in Japanese Patent No. 3337677, the longitudinal movement of the transfer mechanism on the transferring passage becomes increased, so that a large amount of particles can be generated from a guide rail along which the transfer mechanism moves longitudinally and a driving mechanism thereof. Thus generated particles may be scattered around the liquid processing units and the thermal processing units due to the movement of the transfer mechanism to thereby contaminate a wafer being processed and inflict damages to a resist pattern thereon.

To that end, Japanese Patent No. 3337677 suggests to install a partition wall between two vertically disposed adjacent blocks to separate them from each other and provide a filter for removing particles on the partition wall. However, in case a large amount of particles are generated along the transferring passage as described above, just forming a descending air flow as in the conventional semiconductor manufacturing apparatus is not enough to fully collect and remove the particles through the filter. Moreover, in case the filter is actually provided on the partition wall, a thickness of the partition wall becomes larger. Further, if the number of stacked blocks increases, the height of the apparatus becomes considerably increased, thereby making it difficult to perform a maintenance work thereof.

SUMMARY OF THE INVENTION

It is, therefore, an object of the present invention to provide a semiconductor manufacturing apparatus for suppressing a scattering of particles.

In accordance with an aspect of the present invention, there is provided a semiconductor manufacturing apparatus for manufacturing a semiconductor device on a substrate by performing a process on the substrate, the apparatus including: a transfer mechanism including a moving part for holding the substrate and moving along a longitudinal transferring passage; a plurality of processing units for performing respective processes on the substrate, the processing units being disposed along the transferring passage and the substrate being transferred between the processing units and the transfer mechanism; an exhaust chamber having a gas exhaust opening at the side of the transferring passage, the exhaust chamber being provided under the processing units; a suction exhaust line connected to the exhaust chamber; and a guide member provided inside the exhaust chamber or at a position facing the opening, the guide member extending along the transferring passage.

The position facing the air opening indicates a position where particles generated from the guide member are carried by an air flow formed to flow through the transferring passage into the opening when the inner space of the exhaust chamber is exhausted to be under a negative pressure.

The transfer mechanism and the processing units may be arranged on a common base plate and the exhaust chamber may be formed between the processing units and the base plate. Further, the transferring passage may have at an upper portion thereof a gas injection unit for forming an air flow to be drawn into the gas exhaust opening via the transferring passage.

Furthermore, the exhaust chamber may have therein a driving unit for moving the moving part of the transfer mechanism along the guide member. In this case, the driving unit may have a belt provided in the exhaust chamber with respect to the guide member. In addition, a liquid processing unit and a thermal processing unit may be disposed to face each other having the transferring passage disposed therebetween, the liquid processing unit for performing a liquid processing by coating a liquid chemical on the substrate and the thermal processing unit for performing a heating and/or a cooling process before and after the liquid processing performed by the liquid processing unit; and the exhaust chamber may be provided at the side of the liquid processing unit or the thermal processing unit. Further, there may be stacked a plurality of unit blocks, each of which includes the transfer mechanism, the processing units and the exhaust chamber. The semiconductor manufacturing apparatus may be installed in a clean room, and the atmosphere in the transferring passage may be set under a positive pressure compared with the clean room. And, the suction exhaust line may be provided with a unit for performing a forced exhaust.

In accordance with another aspect of the present invention, there is provided a semiconductor manufacturing method using a semiconductor manufacturing apparatus including a transfer mechanism having a moving part for holding a substrate and moving along a longitudinal transferring passage and a plurality of processing units disposed along the transferring passage to perform respective processes on the substrate, the method including the steps of: transferring the substrate between the transfer mechanism and any one of the plurality of processing units; and suction-exhausting an inner space of an exhaust chamber disposed under the processing units, the exhaust chamber having a gas exhaust opening formed at the side of the transferring passage, while guiding the moving part in the longitudinal direction along a guide member provided in the exhaust chamber or at a position facing the exhaust opening.

The semiconductor manufacturing method may further include the step of injecting a gas from a gas injection unit provided at an upper portion of the transferring passage, wherein the gas flows into the exhaust opening via the transferring passage. Further, a driving unit provided inside the exhaust chamber may guide the moving part along the guide member in the longitudinal direction. Moreover, the semiconductor manufacturing apparatus may be installed in a clean room and the inner space of the exhaust chamber is suction-exhausted by using a forced exhausting unit so that the atmosphere in the transferring passage is maintained under a positive pressure compared with the clean room.

In accordance with the present invention, the exhaust chamber having a gas exhaust opening formed at the side of the transferring passage is provided at a lower portion of the processing units. Further, by suction-exhausting the inner space of the exhaust chamber, the suction air flow from the transferring passage toward the exhaust chamber is formed. Accordingly, even when particles are generated by a moving part of the transfer mechanism moving along the guide rail provided inside the exhaust chamber or along the transferring passage at a position facing the gas exhaust opening of the exhaust chamber, the particles are entrained in the air flow drawn into the exhaust chamber to be removed from the transferring passage.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENT

Figure 1:
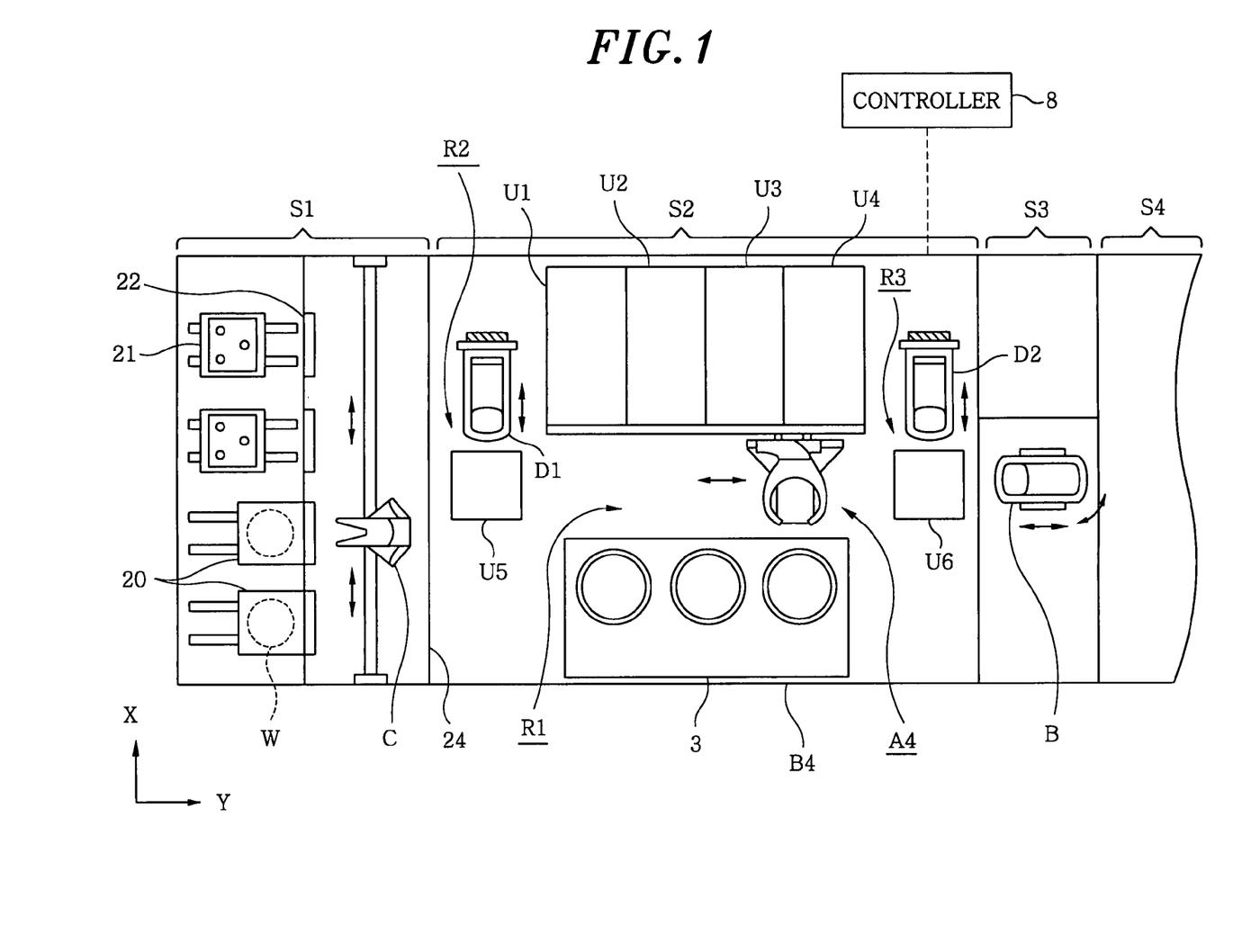
FIG. 1 is a top view of a coating/developing device as a semiconductor manufacturing apparatus in accordance with a preferred embodiment of the present invention.
Figure 2:
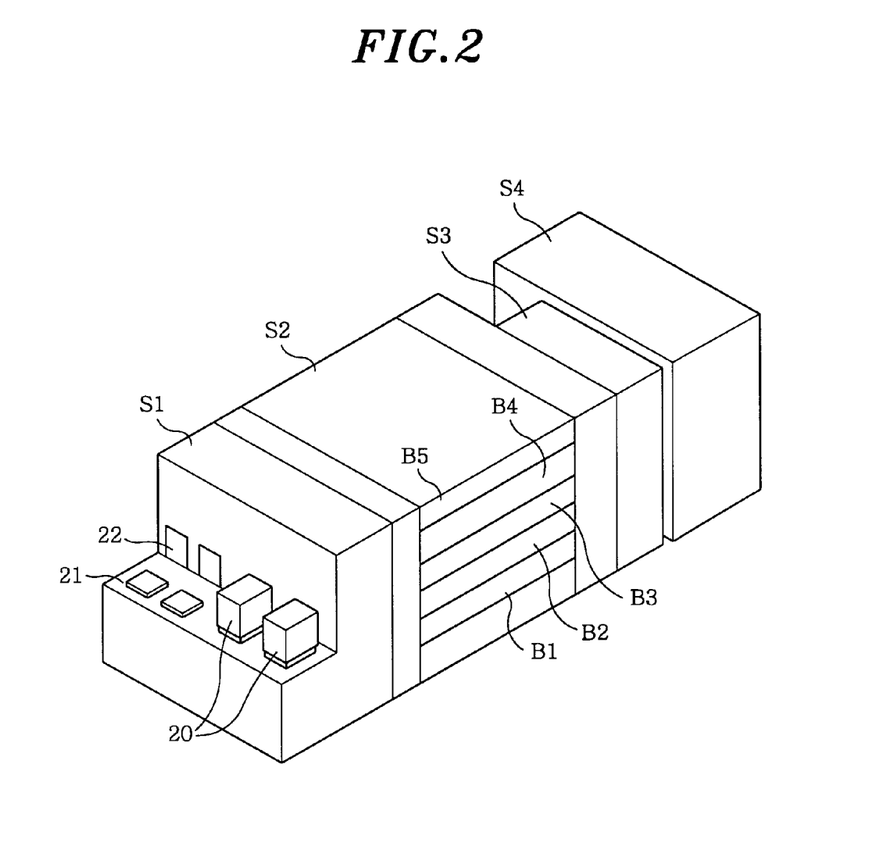
FIG. 2 illustrates a perspective view of the coating/developing device.

Hereinafter, there will be described a coating/developing device as a semiconductor manufacturing apparatus in accordance with a preferred embodiment of the present invention. FIG. 1 is a top view of the semiconductor manufacturing apparatus in accordance with the preferred embodiment of the present invention; FIG. 2 illustrates a schematic perspective view thereof; and FIG. 3 describes a schematic side view thereof. Such semiconductor manufacturing apparatus is installed in a clean room under an atmospheric atmosphere and includes a carrier block S1 for loading/unloading a carrier 20 in which, e.g., thirteen wafers W as substrates are accommodated under a sealed state, a processing block S2 formed by vertically arranging a plurality of, e.g., five unit blocks B1 to B5, an interface block S3 and an exposure device S4. Further, the coating/developing device is installed such that an inner space thereof (an inner space of a housing forming an outer case of the apparatus, i.e., S1 to S3) is under a pressure slightly higher than that of the atmosphere (positive pressure).

The carrier block S1 includes a mounting table 21 capable of mounting thereon a plurality of carriers 20, an opening/closing member 22 provided on a front wall as viewed from the mounting table 21 and a transfer arm C for unloading wafers W from the carrier 20 via the opening/closing member 22. The transfer arm C is configured such that it can freely rotate about a vertical axis and move back and forth, up and down and in a direction of arranging the carriers 20 to thereby transfer the wafers W to transfer stages TRS1 to TRS3 of the unit blocks B1 to B3 to be described later.

The processing block S2 surrounded by a housing 24 is connected to the inner side of the carrier block S1. In this embodiment, the processing block S2 is divided, from the bottom, into a first and a second unit block (DEV layer) B1 and B2 for performing a developing process; a third unit block (BCT layer) B3 for forming a bottom antireflection coating under a resist film (hereinafter, referred to as 'lower bottom antireflection coating'); a fourth unit block (COT layer) B4 for coating resist liquid; and a fifth unit block (TCT layer) B5 for forming an antirefleciton film on the resist film (hereinafter, referred to as 'upper bottom antireflection coating'). Here, the DEV layers B1 and B2 correspond to the unit blocks for performing a developing process. Further, the BCT layer B3, the COT layer B4 and the TCT layer B5 correspond to the unit blocks for forming a coating film. Moreover, there is provided a partition wall (base) between the adjacent unit blocks.

Figure 4:
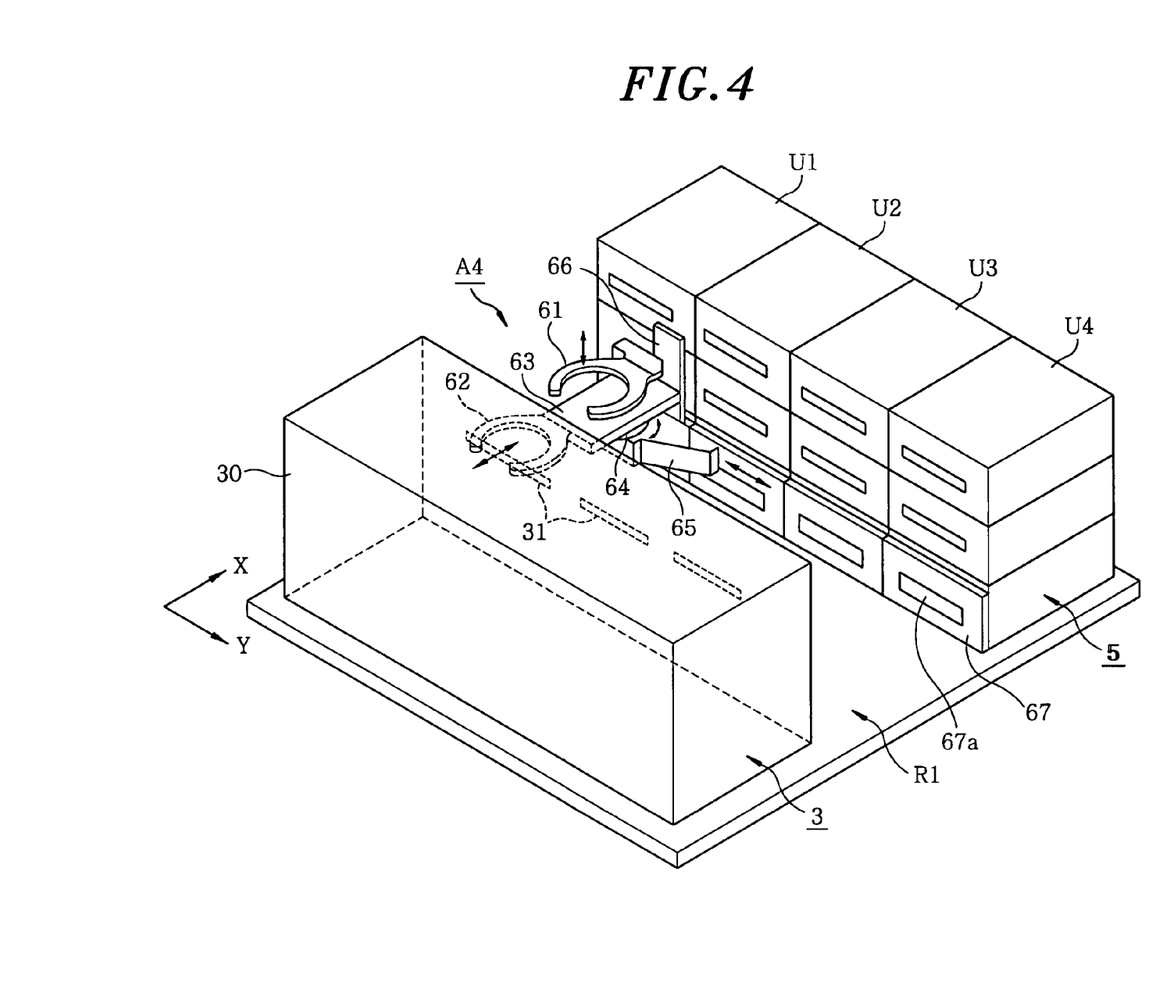
FIG. 4 provides a perspective view of a coating unit, rack units, a main arm and a gas exhaust unit on a COT layer in the coating/developing unit.

The following is a description on a main composition of the first to the fifth unit block B B1 to B5. The unit blocks B1 to B5 are provided with respective characteristic features of the present invention. However, since the respective unit blocks B1 to B5 are formed in approximately same layouts, as an example, the COT layer B4 will be described in detail with reference to FIG. 4 hereinafter. To be specific, a transferring passage R1 for the wafer W is formed at a central portion of the COT layer B4 in a transverse direction, i.e., in a longitudinal direction of the COT layer B4 (Y direction in FIG. 4). Further, at the right side of the transferring passage R1 as viewed from the front side (the carrier block S1 side) toward the inner side, there is provided along the transferring passage R1 a coating unit 3 having a plurality of coating portions, i.e., a liquid processing unit for coating a resist. Furthermore, at the left side of the transferring passage R1 as viewed from the front side (the carrier block S1 side) toward the inner side, there are provided along the transferring passage R1 four rack units U1 to U4 having multistory thermal processing units of a heating/cooling system in that order and a gas exhaust unit 5. In other words, the coating unit 3 and the rack units U1 to U4 are so arranged to face each other having the transferring passage R1 arranged therebetween. The rack units U1 to U4 include two-story thermal processing units for carrying out a pre-treatment and a post-treatment of a processing performed by the coating unit 3. Moreover, the gas exhaust unit 5 is placed under the rack units U1 to U4.

The aforementioned thermal processing unit includes a heating unit, referred to as a pre-baking unit (PAB), for performing a heat treatment of the wafer after a resist liquid coating process; a cooling unit for adjusting the wafer W to a specific temperature before the resist liquid coating process; a peripheral edge exposure device for exclusively exposing an edge portion of an unexposed wafer W and the like. In this embodiment, the PABs 4 are stacked as the rack units U1 and U2; the cooling units as the rack unit U3; and the peripheral edge exposure devices as the rack unit U4.

Figure 5:
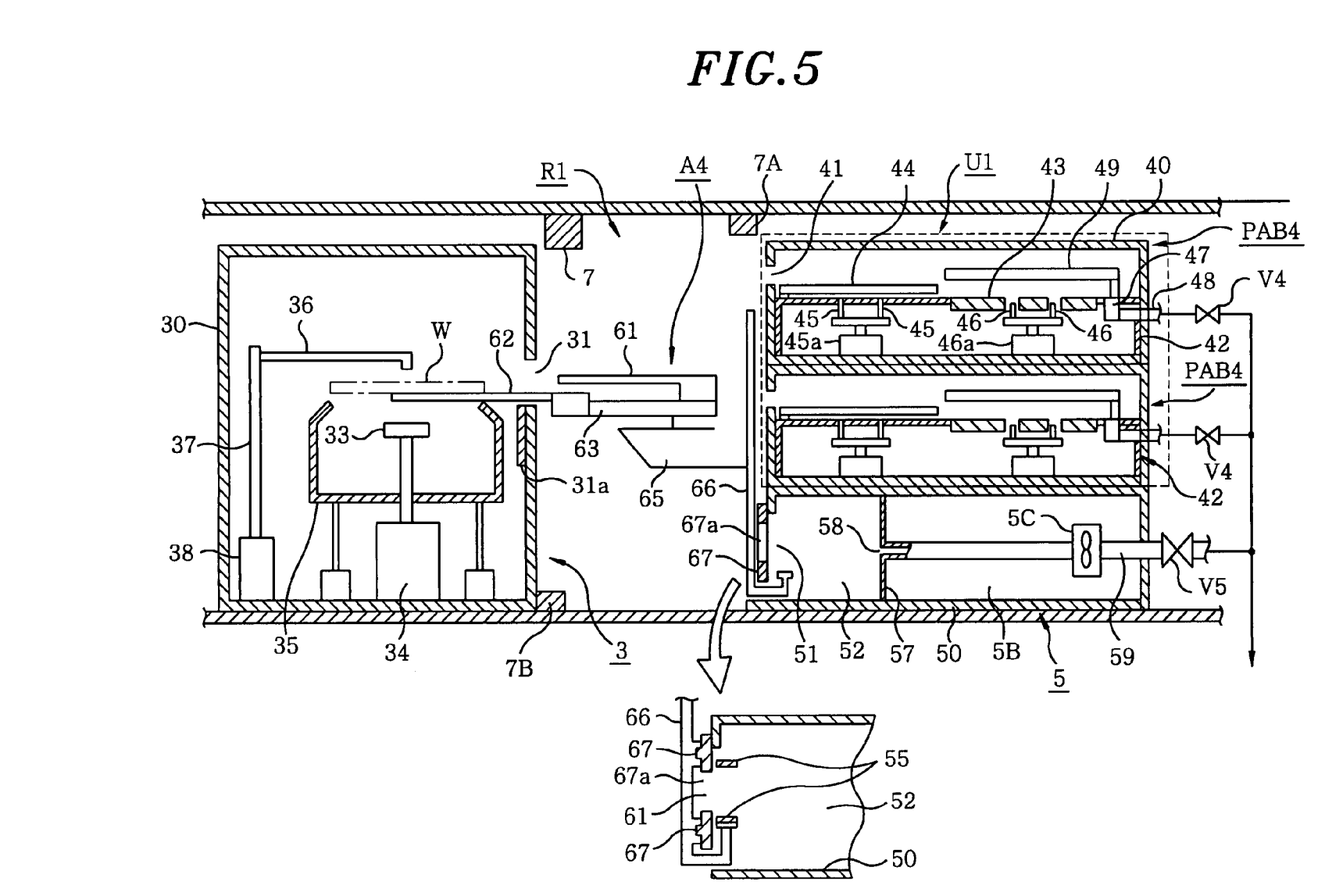
FIG. 5 presents a vertical sectional side view of the COT layer.

FIG. 5 is a vertical sectional side view of the unit block B4. Hereinafter, a main composition of the coating unit 3 will be described briefly with reference to FIG. 5. The coating unit 3 includes a housing 30 and three spin chucks 33 each of which forms a substrate supporting unit are disposed in the housing 30, wherein each of the spin chucks 33 can freely move up and down and rotate about a vertical axis by a driving unit 34. Further, a cup 35 is provided to surround the spin chuck 33, and a liquid draining unit (not shown) including an exhaust line or a drain tube is provided at the bottom wall of the corresponding cup 35. Reference numeral 36 indicates a supply nozzle which is provided on a support 37 such that it can vertically move therealong freely. The supply nozzle can also freely move in the Y direction through the support 37 by a driving unit 38.

In the coating unit 3, the wafer W is loaded into the housing 30 via a transfer port 31 by using a main arm A4 and then transferred to the predetermined spin chuck 33. Further, the resist liquid is supplied through the supply nozzle 36 onto a central portion of the wafer W while the spin chuck 33 is rotated. Accordingly, the resist liquid is spread in a diametrical direction of the wafer W by a centrifugal force, thereby forming a resist liquid film on the surface of the wafer W. The wafer W, on which the resist liquid film is formed, is unloaded outside the coating unit 3 by using the main arm A4 via the transfer port 31. Moreover, a freely openable/closable shutter 31a is provided at the transfer port 31. The shutter 31a remains closed except when the main arm A4 enters the housing 31, thereby suppressing an air flow formed in the transferring passage R1 to be described later and particles entrained in the air flow to be introduced into the housing 31.

Figure 6:
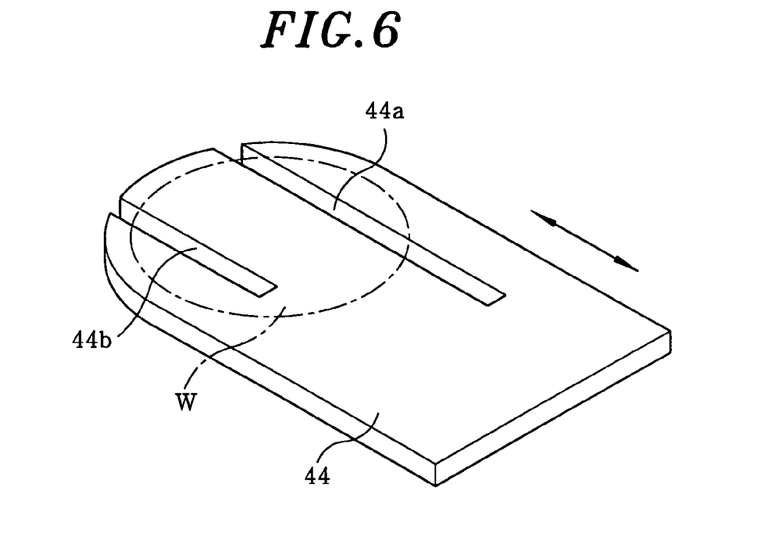
FIG. 6 represents a perspective view of a cooling plate provided at a PAB included in the rack units.

Hereinafter, the PAB 4 forming the rack unit U1 will be described. In FIG. 5, reference numeral 40 indicates a housing, and a base 42 is installed inside the housing 40. Reference numeral 41 denotes a transfer port facing the transferring passage R1. When defining the side of the transferring passage R1 as a front side, a cooling plate 44 provided on the base 42 is horizontally movable freely between the front side and the inner side. FIG. 6 provides a perspective view of the cooling plate 44, and reference numerals 44a and 44b in FIG. 6 indicate slits through which pins to be described later pass, respectively. Moreover, a heat plate 43 and a gas exhaust unit 47 are inserted in the base 42 in that order starting from the front side toward the inner side. A gas exhaust port (not shown) formed with a plurality of small holes is provided along the Y direction on each of the top surface of the gas exhaust units 47 and the side surface inserted in the base 42. The gas exhaust port communicates with a corresponding gas exhaust line 48 connected to the gas exhaust unit 47. The gas exhaust line 48 extends to the outside of the housing 40. Further, by connecting an end of the gas exhaust line 48 to, e.g., a factory exhaust power (factory exhaust line), the inner space of the housing 40 is evacuated. Reference character V4 indicates a valve installed in the gas exhaust line 48.

Provided in an inner space surrounded by the base 42 are a driving unit (not shown) including, e.g., a cylinder for driving the cooling plate and elevation mechanisms 45a and 46a. Further, pins 45 and 46 are connected to the elevation mechanisms 45a and 46a, respectively. By elevating the pin 45 with the help of the elevation mechanism 45a, the wafer W is transferred between the transfer arm A4 to be described later and the cooling plate 44. Furthermore, by elevating the pin 46 with the help of the elevation mechanism 46a, the wafer W is transferred between the heat plate 43 and the cooling plate 44. Moreover, provided at the front side of the top surface of the base 42 is a hole (not shown) communicating with the inner space of the base 42. And also, the inner space thereof communicates with the gas exhaust hole formed at the side surface of the gas exhaust unit 47.

Figure 7:
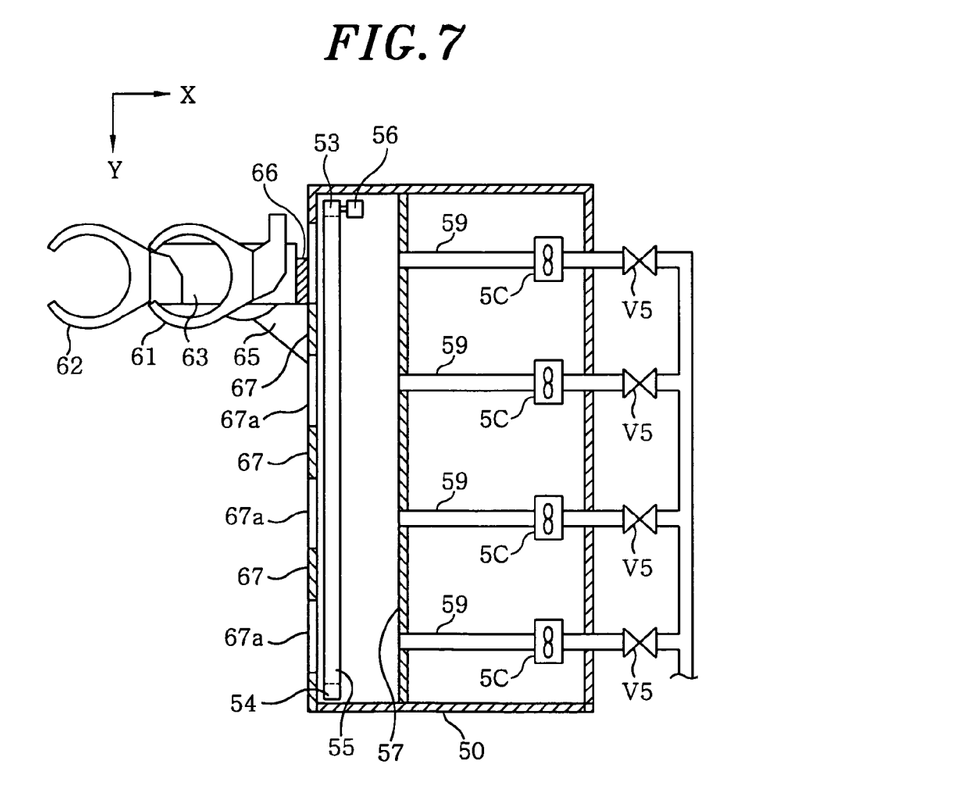
FIG. 7 offers a horizontal sectional top view of the gas exhaust unit.

Hereinafter, the gas exhaust unit 5 will be described with reference to FIGS. 5 and 7. The gas exhaust unit 5 includes a housing 50, wherein an air inlet 51 serving as a gas exhaust opening is provided to face the transferring area R1. Moreover, an exhaust chamber 52 is provided along the transferring passage R1 inside the housing 50. Besides, provided inside the exhaust chamber 52 is a driving unit for moving a vertical guide rail 66 to be described later. As shown in FIG. 7, the driving unit includes a driving pulley 53 and a driven pulley 54 which are rotated about respective horizontal axes, the driving pulley 53 and the driven pulley 54 being provided at both end portions in the longitudinal direction (Y direction) of the exhaust chamber 52. Further, a driving belt 55 is wound around the pulleys 53 and 54. The driving pulley 53 is rotated by a driving mechanism 56 including a motor, and the driving belt 55 is moved to turn around by being engaged with the rotation of the driving pulley 53.

An inner portion of the exhaust chamber 52 serves as a containing chamber 5B for electric equipments (not shown), and the containing chamber 5B and the exhaust chamber 52 are separated by a partition wall 57. Provided at the partition wall 57 along the transferring passage R1 is a plurality of gas exhaust holes 58 spaced apart from each other. The respective gas exhaust holes 58 communicate with respective gas exhaust lines 59 provided as a gas exhaust passage. The gas exhaust lines 59 extend by passing through between the electric equipments to the outside of the housing 50. Provided in each of the gas exhaust lines 59 is a fan 5C which forces the gas to be exhausted. Further, each valve V5 is installed at a downstream of each fan 5C. The gas exhaust lines 59 communicate each other at a downstream of the valves V5, and the end portions thereof are connected to, e.g., the factory exhaust line. Moreover, the fans 5C are configured such that a gas suction/exhaust amount thereof can be adjusted by controlling the revolution number thereof with a controller 8 to be described later. For example, in case an exhausting capacity of a factory exhaust side is small and a designed exhaust amount is not reached, it is useful to perform the forced exhaust by using the fans 5C. In this case, the gas suction/exhaust amount of the fans 5C is controlled such that the transferring passage R1 is under a positive pressure atmosphere greater than that in the clean room. In addition, the gas suction/exhaust amount can be adjusted by controlling an opening degree of the valve V5 while maintaining the revolution number of the fans 5C constant or by providing a damper instead of the valve V5. On the other hand, in case the exhausting capacity of the factory is large and the designed exhaust amount can be reached without any unit for performing the forced exhaust, the atmosphere in the transferring passage R1 can be set under a positive pressure greater than that in the clean room by controlling the opening degree of the valve or the damper without providing the forced exhaust unit.

Figure 8:
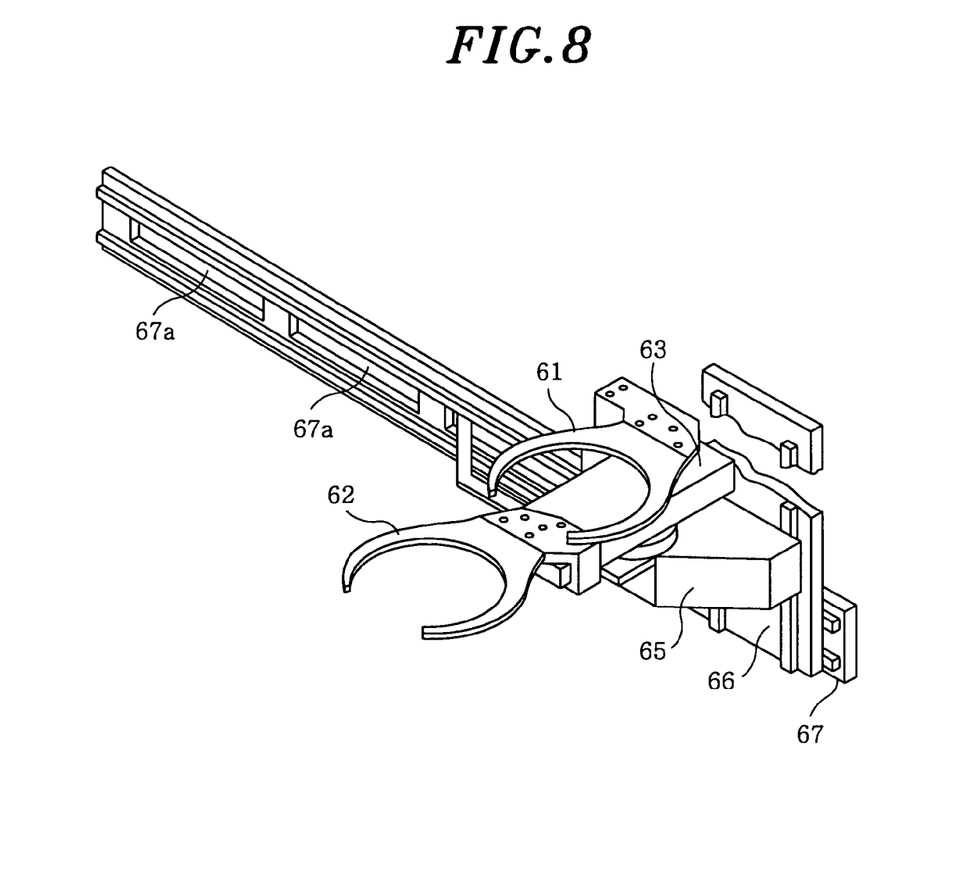
FIG. 8 sets forth a perspective view depicting an example of the main arm.

Hereinafter, the main arm A4 serving as a transfer mechanism provided at the transferring passageway R1 will be described. The following is a description on a structure of the main arm A4 for transferring the wafer W between the modules (where the wafer W is positioned) on the COT layer B4, e.g., between each processing unit of the rack units U1 to U4, the coating unit 3 and the rack units U5 and U6 to be described later. Referring to FIGS. 5 and 8, the main arm A4 has two arm members 61 and 62 for supporting a peripheral portion of a backside of the wafer W, wherein the arm members 61 and 62 are configured to be independently movable back and forth on the base 63. Further, the base 63 is rotatably provided on an elevation member 65.

Besides, the main arm A4 includes a guide rail as a longitudinally extended guide member, and the guide rail 67 has a plurality of longitudinal holes 67a provided along the longitudinal direction. The holes 67a of the guide rail 67 are located at respective positions facing the air inlet 51 of the gas exhaust unit 5 to overlap therewith, so that the gas in the transferring passage R1 can be sucked into the exhaust chamber 52 via the air inlet 51. Here, the position facing the air inlet 51 (opening) indicates a position where particles are carried by an air flow formed to flow through the transferring passage R1 into the air inlet 51 when the inner space of the exhaust chamber 52 is exhausted to be under a negative pressure. Reference numeral 66 denotes the vertical guide rail, and the elevation member 65 is configured to freely move up and down along the vertical guide rail 66. In this embodiment, a moving part is comprised of the elevating guide rail 66, the arm members 61 and 62, the base 63 and the elevation member 65. The lower end portion of the vertical guide rail 66 of the main arm A4 is bent around the lower portion of the guide rail 67 to be extended upward in the exhaust chamber 52 of the gas exhaust unit 5 to be connected to the driving belt 55. Thus, the driving unit moves the vertical guide rail 66 along the horizontal guide rail 67, thereby making it possible to move the elevation member 65 longitudinally along the transferring passage R1.

Figure 9A:
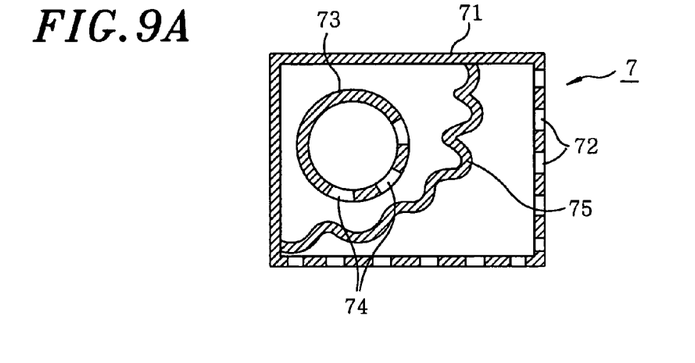
FIGS. 9A and 9B show vertical sectional side views of a gas injection unit and a gas exhaust unit provided in a transferring passage, respectively.

A gas injection unit 7 as depicted in FIG. 9 is provided near the coating unit 3 in a ceiling portion of the transferring passage R1. The gas injection unit 7 has, e.g., a quadrilateral housing 71 and is provided along the transferring passage R1 to cover the entire area thereof. A surface of the housing 71 facing the transferring area R1 is of a punched metal structure, for example, and has a plurality of holes 72 communicating with the inner space of the housing 71. Further, provided inside the housing 71 is an air feed duct 73 having gas injection openings 74 at a side portion thereof. The air feed duct 73 is connected to a gas supply unit (not shown) for supplying a clean air thereinto, which is provided at the ceiling portion of the end portion of the transferring passage R1 at the side of the carrier block S1. Moreover, an ULPA filter 75 for removing particles is so provided as to surround the side portion of the air feed duct 73 in the housing 71. If the clean air is supplied from the gas supply unit into the air feed duct 73, the clean air is injected through the gas injection openings 74 and then radially supplied to the entire transferring passage R1 via the ULPA filter 75 and the holes 72.

Figure 9B:
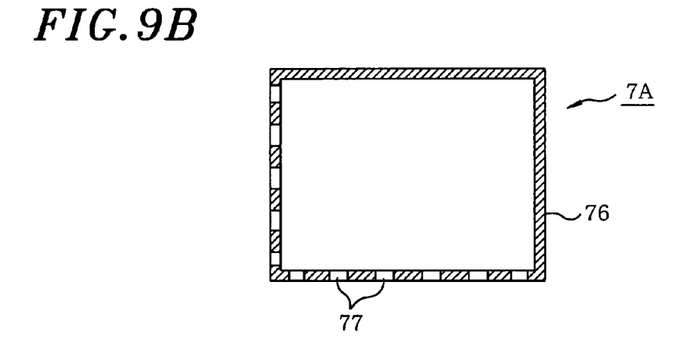
Figure 9C:
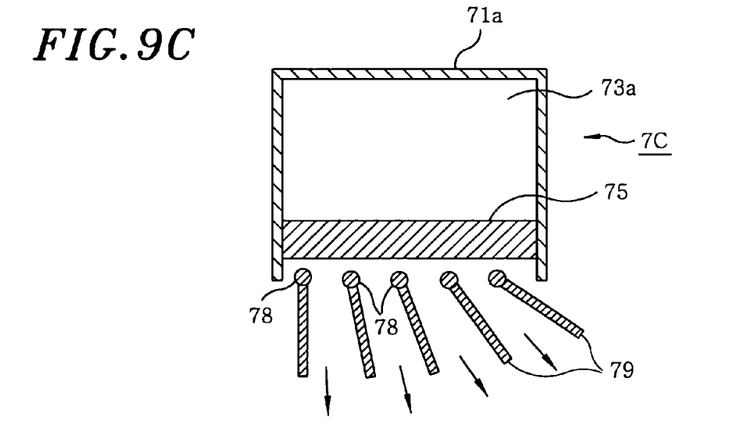
FIG. 9C shows a modification of the gas injection unit.

As the gas injection unit, there may be employed the one illustrated in FIG. 9C. The gas injection unit 7C includes a quadrilateral housing 71a with an open bottom and is provided along the transferring passage R1 to cover the entire area thereof. The ULPA filter 75 is provided at a lower portion of the housing 71a, and a space surrounded by the housing 71a and the ULPA filter 75 serves as an air feed duct 73a. Further, a gas supply unit (not shown) for supplying a clean air into the air feed duct 73a is connected to an end of the air feed duct 73a at the side of the carrier block S1 or the interface block S3. Disposed under the ULPA filter 75 is a plurality of shaft members 78 extending in parallel with the transferring passage R1. Louvers 79 for restricting a gas flow direction are provided at lower portions of the respective shaft members 78. The louvers 79 are rotatable about the respective shaft members 78, so that the orientations thereof can be adjusted. The clean air supplied from the gas supply unit is introduced into the air feed duct 73a and then flows through the ULPA filter 75 to the outside under the housing 71a. At this time, as indicated by arrows in FIG. 9C, the clean air is supplied in specified directions in the transferring passage R1 by using the louvers 79.

Gas exhaust units 7A and 7B are respectively provided near the rack units U1 to U4 at the ceiling portion of the transferring passage R1 and near the coating unit 3 at the bottom surface of the transferring passage R1, the gas exhaust units 7A and 7B being provided along the transferring passage R1 to cover the entire area thereof. The gas exhaust units 7A and 7B have a same configuration, and each of them includes, e.g., a quadrilateral housing 76 as shown in FIG. 9B. A surface of the housing 76 facing the transferring area R1 is of a punched metal structure and has a plurality of holes 77 communicating with the inner space of the housing 76. End portions of the gas exhaust units 7A and 7B are connected to a suction mechanism (not illustrated) including, e.g., an ejector pump. The suction mechanism makes the inner space of the housing 76 be kept under a negative pressure atmosphere, so that a specific amount of gas in the transferring passage R1 can be exhausted via the holes 77. Furthermore, the end portions of the gas exhaust units 7A and 7B may be connected to, e.g., the factory exhaust line (factory exhaust power) instead of the ejector pump to evacuate the transferring passage R1.

Figure 3:
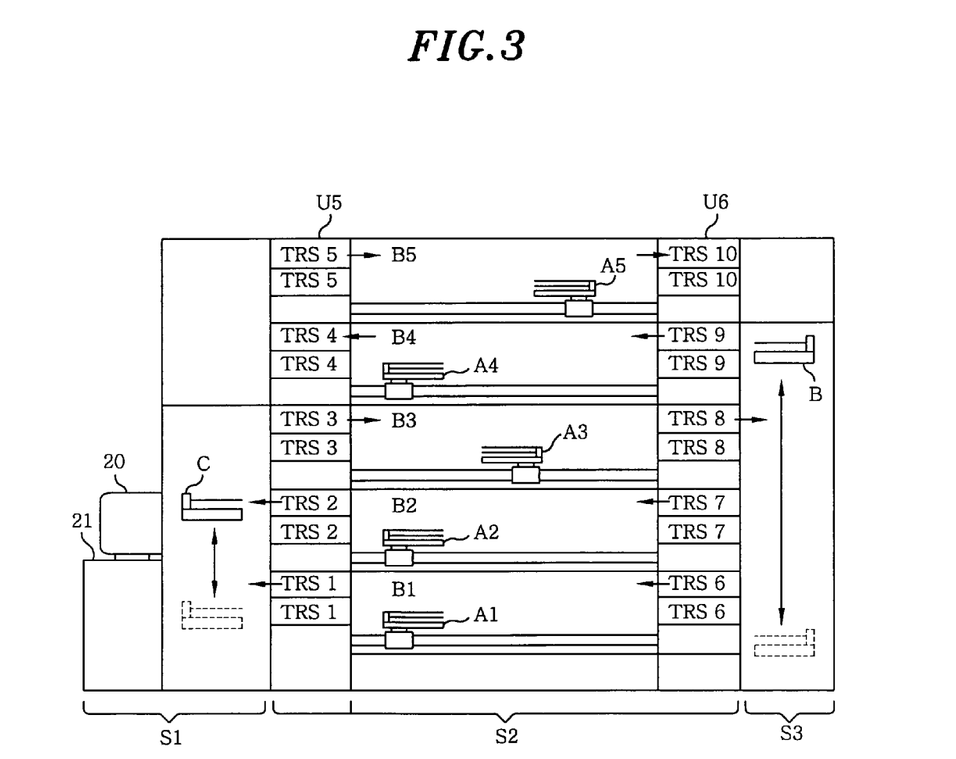
FIG. 3 describes a side sectional view of the coating/developing device.

An area adjacent to the carrier block S1 in the transferring passage R1 serves as a first wafer transferring area R2. As shown in FIGS. 1 and 3, there is provided the rack unit U5 at a position in the area R2 where each of the transfer arm C and the main arm A4 can have an access as well as a first conveyance arm D1 for transferring the wafer W to and from the rack unit U5. In this embodiment, as shown in FIG. 3, the rack unit U5 includes transfer stages TRS1 to TRS5 respectively corresponding to the unit blocks B1 to B5, wherein each transfer stage contains one or more, e.g., two stages as shown in FIG. 3, so that the wafer W can be transferred between the rack unit U5 and the main arms A1 to A5 of the respective unit blocks B1 to B5.

In addition, the first conveyance arm D1 can freely move back and forth and up and down so that the transfer of the wafer W can be carried out with respect to the transfer stages TRS1 to TRS5. Moreover, in this embodiment, the transfer stages TRS1 to TRS3 are configured to carry out the transfer of the wafer W to and from the transfer arm C.

Further, an area adjacent to the interface block S3 in the transferring passage R1 serves as a second wafer transferring area R3. As illustrated in FIG. 3, there are provided the rack unit U6 at a position where the main arm A4 can have an access and a second conveyance arm D2 for transferring the wafer W to and from the rack unit U6.

Figure 10:
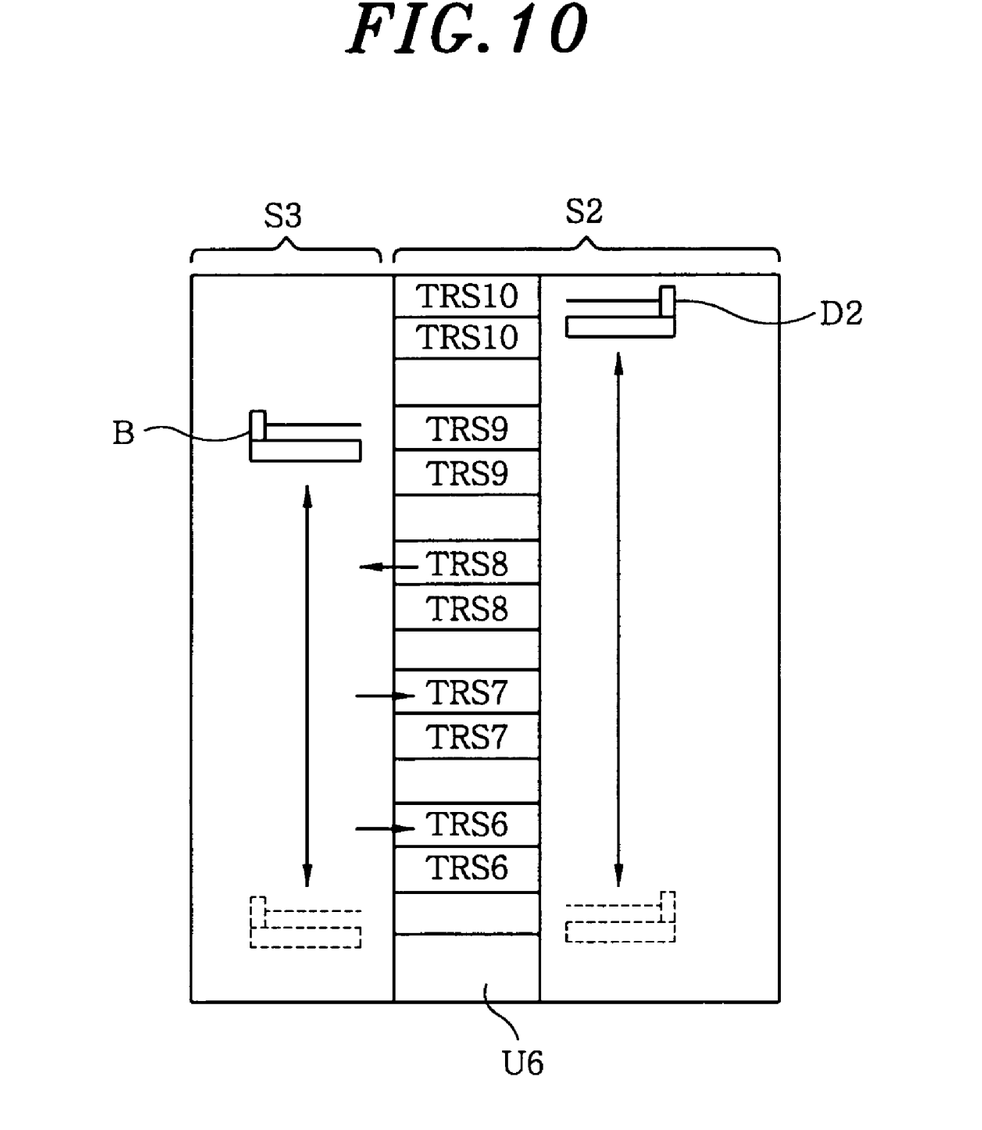
FIG. 10 is a side sectional view of an interface block in the coating/developing device.

As depicted in FIGS. 3 and 10, in this embodiment, the rack unit U6 includes transfer stages TRS 6 to TRS 10 respectively corresponding to the unit blocks B1 to B5, wherein each transfer stage contains one or more, e.g., two stages as shown in FIG. 10, so that the wafer W can be transferred between the main arms A1 to A5 of the respective unit blocks B1 to B5 and the second conveyance arm D2. Further, the second conveyance arm D2 can freely move back and forth and up and down so that the transfer of the wafer W can be carried out to and from the respective transfer stages TRS6 to TRS 10. As described above, in this embodiment, the wafer W can be transferred via the respective transfer stages TRS1 to TRS5 and TRS6 to TRS10 between the respective unit blocks B1 to B5 stacked in five layers by using the aforementioned first and second conveyance arms D1 and D2.

Furthermore, the exposure device S4 is connected via the interface block S3 to the inner side of the rack unit U6 in the processing block S2. The interface block S3 includes an interface arm B for transferring the wafer W between the rack unit U6 of the processing block S2 and the exposure device S4. The interface arm B, which is freely movable back and forth and up and down and rotatable about the vertical axis thereof, serves as a transfer mechanism of the wafer W interposed between the processing block S2 and the exposure device S4. In this embodiment, the transfer of the wafer W is carried out with respect to the lower four transfer stages TRS6 to TRS9 for the unit blocks B1 to B4.

Hereinafter, the other unit blocks will be described briefly. The DEV layers B1 and B2, the BCT layer B3, the TCT layer B5 are configured substantially same as the COT layer B4. The differences are as follows: the coating unit 3 serving as a liquid processing unit employs a liquid chemical for a bottom antireflection coating or a developing liquid chemical (developing solution) instead of the resist liquid; a different method for coating the liquid chemical; and different processing conditions in the heating system and the cooling system.

The coating/developing device includes a controller 8 having a program storage comprised of a computer, for example. The program storage stores therein, e.g., software programs having instructions for performing operations of the semiconductor manufacturing apparatus, i.e., a treatment of the wafer W, a transfer of the wafer W, an exhaust and an air flow control and the like. Further, the controller 8 controls the operations of the semiconductor manufacturing apparatus by reading out the corresponding programs. Moreover, such programs are stored in the program storage of a recording medium such as a hard disk, a compact disk, a magnet optical disk or the like.

Hereinafter, the operation of the coating/developing device will be described by using an exemplary case where the bottom antireflection coating is formed on a top and a bottom of a resist film. First, a transfer flow of the wafer W will be described. The carrier 20 is loaded from the outside into a carrier block 21 and the wafer W is then taken out from the carrier 20 by using the transfer arm C. The wafer W is transferred from the transfer arm C to the main arm A3 of the BCT layer B3 via the transfer stage TRS3 of the rack unit U5 to be transferred therefrom to the BCT layer B3. Further, in the BCT layer B3, the wafer W is transferred from the cooling unit through a bottom antireflection coating forming unit (although not shown, it is a unit corresponding to the coating unit 3 in FIG. 5), the heating unit to the transfer stage TRS 3 of the rack unit U5, in that order, thereby forming a lower bottom antireflection coating.

Subsequently, the wafer on the transfer stage TRS 3 is transferred to the transfer stage TRS4 by the first conveyance arm D1 and then to the main arm A4 of the COT layer B4 to be transferred therefrom to the COT layer B4. Further, in the COT layer B4, the wafer W is transferred from the cooling unit through the coating unit 3 to the PAB 4 by the main arm A4, in that order, thereby forming a resist film on the lower bottom antireflection coating. Next, the wafer is transferred to a peripheral edge exposure device and the wafer whose peripheral edge has been exposed is then transferred to the transfer stage TRS4 of the rack unit U5.

Thereafter, the wafer on the transfer stage TRS4 is transferred to the transfer stage TRS5 by using the first conveyance arm D1 and then to the main arm A5 of the TCT layer B5 to be transferred therefrom to the TCT layer B5. Further, in the TCT layer 5, the wafer W is transferred from the cooling unit through a second bottom antireflection coating forming unit (although not shown, it is a unit corresponding to the coating unit 3 in FIG. 5), the heating unit, the peripheral edge exposure device to the transfer stage TRS10 of the rack unit U6, in that order, thereby forming an upper bottom antireflection coating on the resist film.

Then, the wafer on the transfer stage TRS10 is transferred to the transfer stage TRS8 of the rack unit U6 by using the second conveyance arm D2 to be transferred therefrom to the interface arm B. Next, the wafer W on the stage TRS8 is transferred to the exposure device S4 by the interface arm B and is then subjected to a specific exposure process.

The exposure-processed wafer W is transferred to the transfer stages TRS6 or TRS7 of the rack unit U6 by the interface arm B to be transferred therefrom to the DEV layer B1 or B2. Then, the wafer W on the transfer stage TRS6 or TRS7 is received by the main arm A1 or A2 of the DEV layer B1 or B2. Next, in the DEV layer B1 or B2, the wafer is transferred to a heating unit and a developing unit (although not shown, it is a unit corresponding to the coating unit 3 in FIG. 5), in that order, and is then subjected to a specific developing process, the heating unit and the developing unit being included in the rack units U1 to U4. The developing-processed wafer is transferred to the transfer stage TRS1 or TRS2 of the rack unit U5 to be transferred therefrom to the transfer arm C and is then returned to the original carrier 20 mounted on the carrier block S1 by the transfer arm C.

Figure 11:
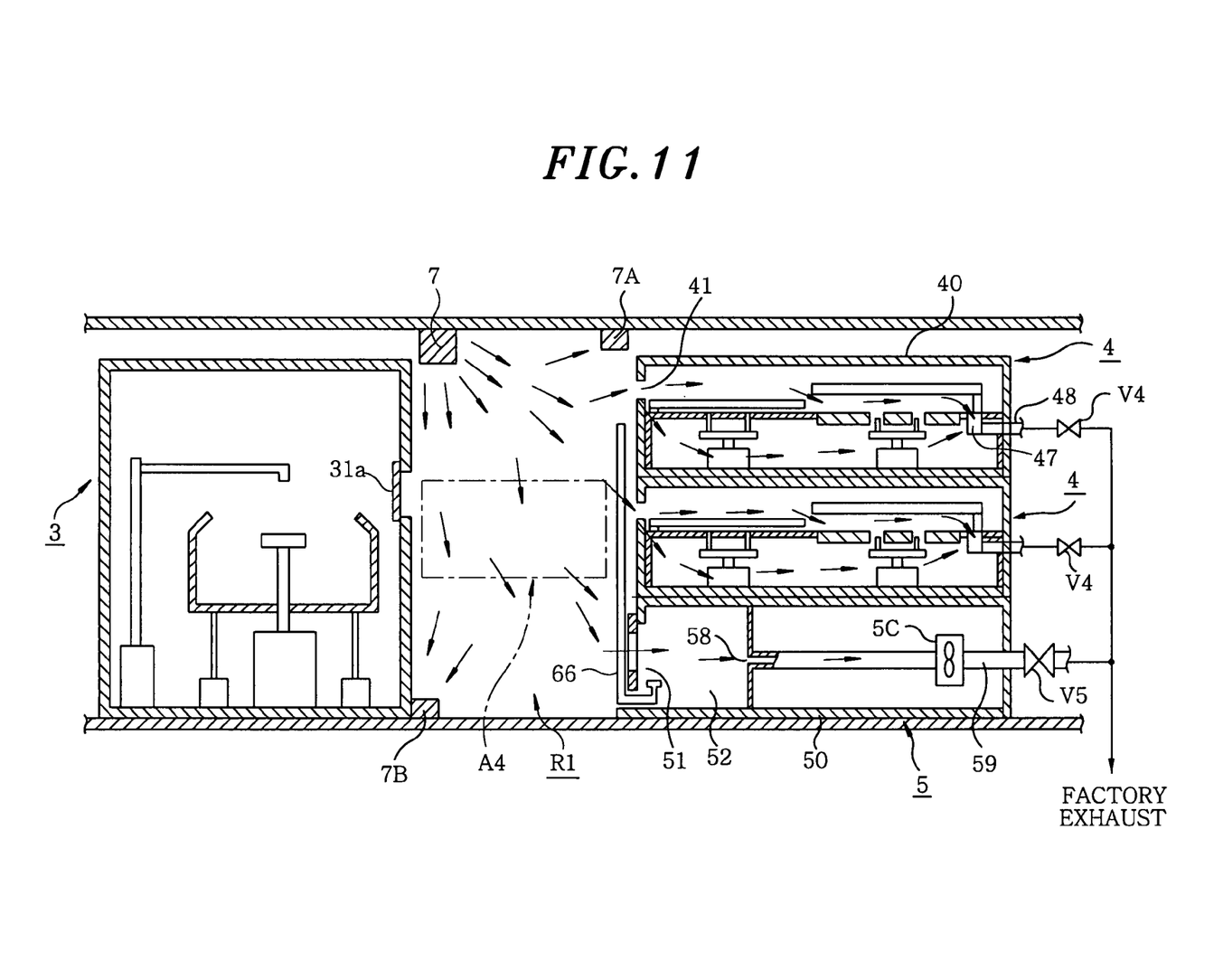
FIG. 11 provides a schematic diagram illustrating an air flow in the transferring passage on the COT layer.

Meanwhile, in the respective unit blocks B1 to B5, air flows are formed to be exhausted as shown in FIG. 11 wherein the unit block B4 is illustrated as an example. A clean air is radially injected from the gas injection unit 7 toward the transferring passage R1, while the exhaust is performed by the gas exhaust units 7A and 7B. The clean air injected from the gas injection unit 7 is drawn by the suction exhaust of the factory exhaust line into the exhaust chamber 52 through the air inlet 51 after passing through around the main arm A4, into the PAB (heating unit) 4 through the transfer port 41 or into the gas exhaust units 7A and 7B to be discharged from the transferring passage R1. The clean air introduced into the exhaust chamber 52 is discharged from the gas exhaust unit 5 via the gas exhaust line 59. Further, the clean air introduced into the PAB 4 flows into the gas exhaust unit 47 after passing through above the base 42 or into the lower space of the base 42 through holes (not shown) formed in the top surface of the base 42 along the entire longitudinal width of the transfer port 41. Moreover, the clean air drawn into the lower space passes around the driving unit and the elevation mechanisms 45a and 46a in the base 42 and then is drawn into the gas exhaust unit 47 to be discharged from the PAB 4 via the gas exhaust line 48.

Similarly to the above, in the unit blocks other than the COT layer B4, an air suction flow is formed in the transferring passage R1. In this embodiment, since each unit block is formed in the same layout, there is formed the same air suction flow as that in the COT layer B4.

In accordance with this embodiment, by suction-exhausting the inner space of the exhaust chamber 52 having the air inlet 51 facing the transferring passage R1, an air flow to be drawn into the exhaust chamber 52 is formed in the transferring passage R1. Further, although particles may be easily generated due to the movement of the vertical guide rail 66 along the guide rail 67, since the guide rail is provided at a position facing the air inlet 51, the generated particles are entrained in the air flow sucked into the exhaust chamber 52 to be removed from the transferring passage R1. Accordingly, the particles are prevented from being adhered to the wafer W supported by the transfer mechanism or to the arm members 61 and 62 in the transfer mechanism. And, also, the particles are prevented from being introduced into the rack units U1 to U4 and the coating unit 3 facing each other with the transferring passage R1 therebetween, thereby making it possible to reduce the particle contamination on the wafer W. As a result, it is possible to suppress defects of an exposure pattern and damages inflicted to the pattern during the developing process. Further, a fine resist pattern can be formed on the wafer W with high accuracy.

Since the clean air is supplied from the gas injection unit 7 toward the transferring passage R1 to be exhausted through the gas exhaust units 7A and 7B provided in the transferring passage R1, the air flow is formed all around the transferring passage R1, so that even if particles are generated from each driving part of the main arm A4, the particles are certainly removed from the transferring passage R1 along with the air flow. Moreover, due to the exhaust performed through the gas exhaust unit 7A, the particles are prevented from being scattered along with a turbulence of the air flow swirling at an end position of the ceiling portion of the transferring passage R1 near the rack units U1 to U4. Besides, since the exhaust is carried out through the gas exhaust unit 7B provided on the bottom surface, the particles are prevented from being deposited on the bottom surface of the transferring passage R1 and, accordingly, the particle contamination of the wafer W is secured to be further suppressed.

The inner spaces of the carrier block S1, the processing block S2 and the interface block S3 included in the coating/developing device are under a positive pressure atmosphere compared with the outside thereof. Thus, an air flow is suppressed from being introduced into the housings of the respective blocks from outside, thereby suppressing particles from being introduced into the coating/developing device with the air flow. And also, since the air flow formed in the transferring passage R1 is suppressed from being scattered due to the aforementioned air flow introduced into the housings of the blocks from outside, it is possible to certainly suppress the particle contamination on the wafer W supported by the transfer mechanism, the adhesion of the particles to the arm members 61 and 62 in the transfer mechanism and the introduction of the particles into the coating unit 3 and the rack units U1 to U4 facing each other with the transferring passage R1 therebetween.

In this embodiment, the inner space of the housing 40 of the PAB 4 provided along the transferring passage R1 is under a negative pressure atmosphere and the particles are sucked via the transfer port 41 facing the transferring passage R1, so that the particles generated in the transferring passage R1 can be further secured to be removed from the transferring passage R1.

Besides, since a part of the air flow introduced from the transferring passage R1 into the PAB 4 is exhausted through the gas exhaust unit 47 after passing around the elevation mechanisms 45a and 45b or the driving unit provided inside the base 42, even if particles are generated from the driving unit and the elevation mechanisms 45a and 46b, the particles are removed from the PAB 4 along with the air flow. Consequently, the scattering of the particles is suppressed, so that the particle contamination of the wafer W can be certainly further suppressed.

The driving unit for horizontally moving the vertical guide rail 66 along the guide rail 67 is provided inside the exhaust chamber 52. Therefore, even if particles are generated from the driving unit, the particles are entrained in the air drawn into the exhaust chamber 52 to be removed from the exhaust chamber 52. Accordingly, the particle contamination of the wafer W can be more certainly suppressed.

In this embodiment, the gas exhaust unit 5 is provided under the rack units U1 to U4, more specifically, between the rack units U1 to U4 and the base plate. Therefore, in comparison with a case where the gas exhaust unit is provided at the partition wall for separating the respective unit blocks B1 to B5, a thickness of the partition wall is not significantly increased. As a result, even if the unit blocks are stacked, an increase in overall height of the semiconductor manufacturing apparatus is reduced. Moreover, since a unit block for forming a coating film and that for performing a developing process are provided in different areas, a process of one unit block is prevented from affecting a process of another unit block. Accordingly, a transferring efficiency of the main arm A is improved, thereby making it possible to increase the throughput.

In the present invention, the number of stacked unit blocks and the stacking sequence thereof may be varied without being limited to those in the aforementioned embodiment. In other words, the unit block for performing the developing process may be formed in a single layer, and in the unit block for forming the coating film, the TCT layer, the COT layer and the BCT layer may be stacked in order from the bottom. In addition, the unit block for forming the coating film may be located at a lower position and the unit block for performing the developing process may be located thereon.

Figure 12:
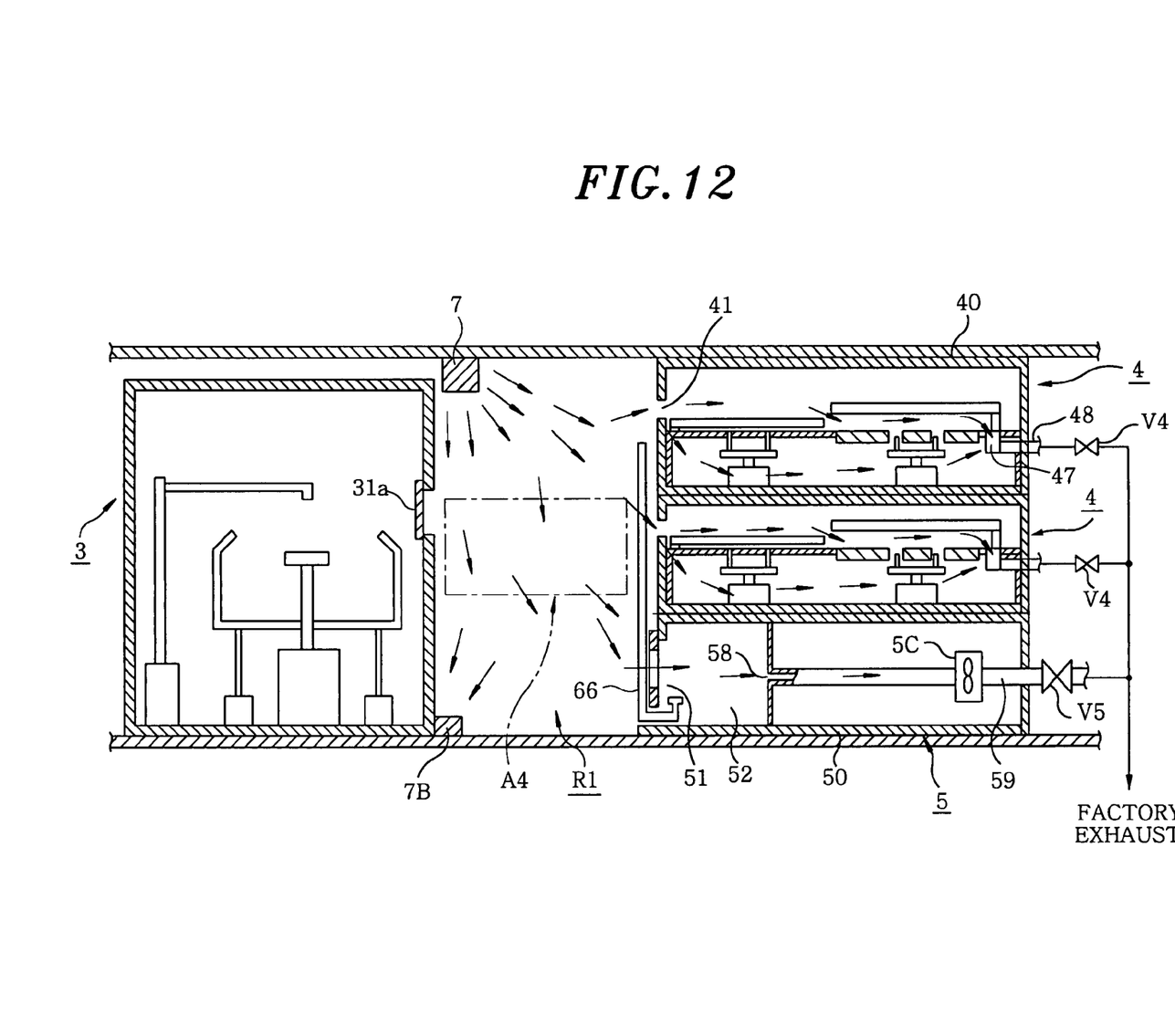
FIG. 12 describes a schematic diagram depicting an air flow in a transferring passage on a COT layer in another preferred embodiment.

In the aforementioned embodiment, instead of providing the gas exhaust unit 7A at the transferring passage R1, as shown in FIG. 12, the ceiling portion of the transferring passage R1 may be provided slightly above an uppermost end position of the main arm A4 when it is moved farthest toward the ceiling surface. With such configuration, it is possible to suppress the air flow from being formed to be swirling as a turbulence at an end position in the ceiling portion in a width direction of the transferring passage R1 near the rack units U1 to U4.

Figure 13:
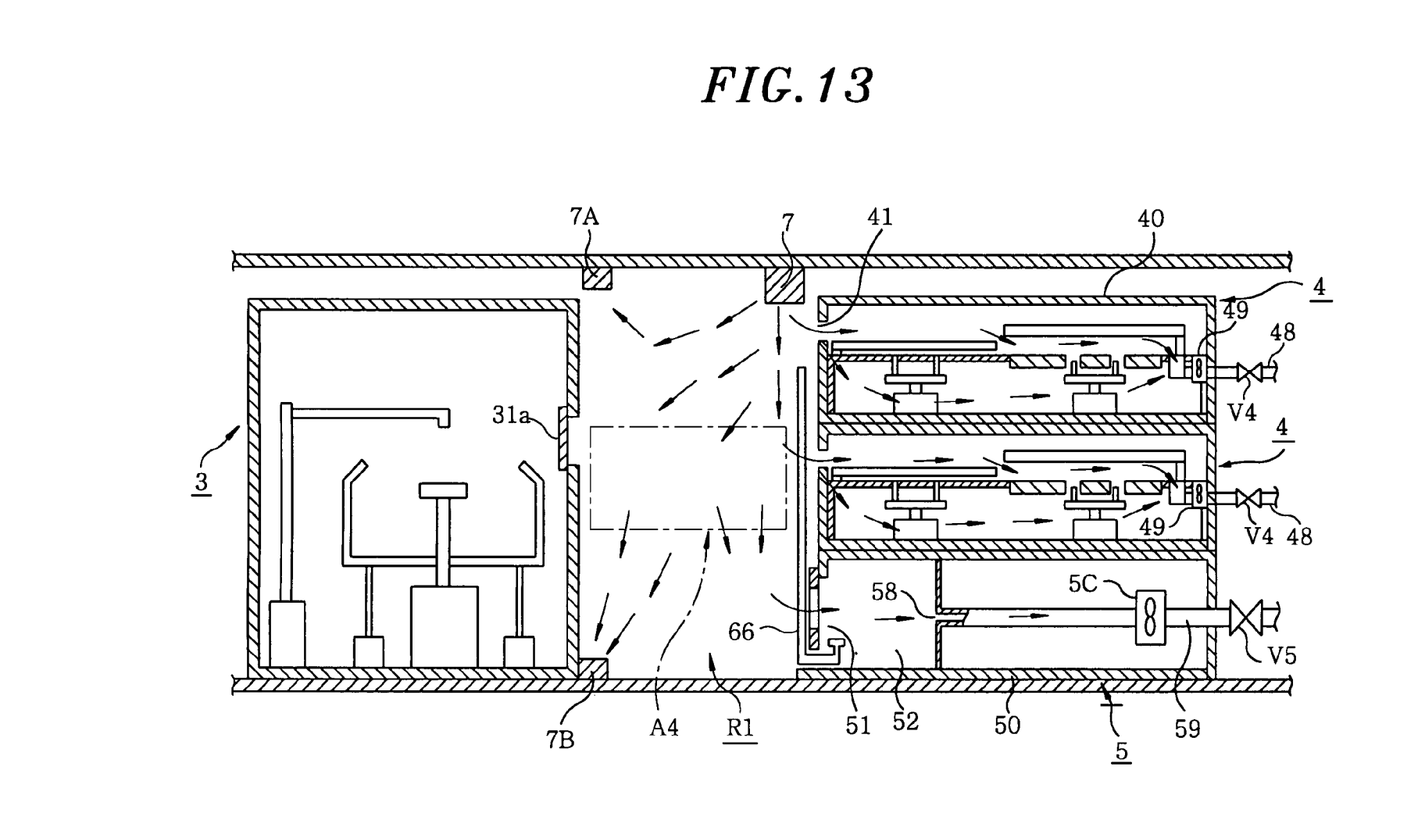
FIG. 13 represents a schematic diagram describing an air flow in a transferring passage on a COT layer in still another preferred embodiment.

As for another preferred embodiment of the present invention, there is shown the COT layer B4 having a composition different from that of the embodiment illustrated in FIG. 13. In comparison with the former embodiment, at the ceiling portion of the transferring passage R1, the gas injection unit 7 is provided near the rack units U1 to U4 and the gas exhaust unit 7A is provided near the coating unit 3 along the transferring passage R1. Moreover, in the PAB 4, the gas exhaust line 48 has a fan 49 provided as a forced exhausting unit at an upstream of the valve V4. In addition, also in the embodiment illustrated in FIGS. 5 and 12, the fan 49 may be installed at the gas exhaust line 48 of the PAB 4.

In the embodiment illustrated in FIG. 13, the gas injection unit 7 radially injects the clean air toward the transferring passage R1. Meanwhile, as in the former embodiment, by performing the exhaust via the exhaust chamber 52 and the gas exhaust unit 47 of the PAB 4 and through the gas exhaust units 7A and 7B, the suction air flow is formed in the transferring passage R1 as indicated by arrows in FIG. 13. With such configuration, the same effects as in the first embodiment can be obtained.

The present invention is also applied to a case where an insulating film is formed by coating, e.g., a liquid precursor of an insulating film, in addition to the case of forming a resist film on a substrate.

While the invention has been shown and described with respect to the preferred embodiments, it will be understood by those skilled in the art that various changes and modification may be made without departing from the scope of the invention as defined in the following claims.

What is claimed is:

1. A semiconductor manufacturing apparatus for manufacturing a semiconductor device on a substrate by performing a process on the substrate, the apparatus comprising:
    a transfer mechanism including a moving part for holding the substrate and moving along a longitudinal transferring passage;
    a plurality of processing units for performing respective processes on the substrate, the processing units being disposed along the transferring passage and the substrate being transferred between the processing units and the transfer mechanism;
    an exhaust chamber having a gas exhaust opening at the side of the transferring passage, the exhaust chamber being provided under the processing units;
    a suction exhaust line connected to the exhaust chamber; and
    a guide member provided inside the exhaust chamber or at a position facing the opening, the guide member extending along the transferring passage.

2. The apparatus of claim 1, wherein the transfer mechanism and the processing units are arranged on a common base plate and the exhaust chamber is formed between the processing units and the base plate.

3. The apparatus of claim 1, wherein the transferring passage has at an upper portion thereof a gas injection unit for forming an air flow to be drawn into the gas exhaust opening via the transferring passage.

4. The apparatus of claim 1, wherein the exhaust chamber has therein a driving unit for moving the moving part of the transfer mechanism along the guide member.

5. The apparatus of claim 4, wherein the driving unit has a belt provided in the exhaust chamber with respect to the guide member.

6. The apparatus of claim 1, wherein a liquid processing unit and a thermal processing unit are disposed to face each other having the transferring passage disposed therebetween, the liquid processing unit for performing a liquid processing by coating a liquid chemical on the substrate and the thermal processing unit for performing a heating and/or a cooling process before and after the liquid processing performed by the liquid processing unit; and the exhaust chamber is provided at the side of the liquid processing unit or the thermal processing unit.

7. The apparatus of claim 1, wherein a plurality of unit blocks, each of which includes the transfer mechanism, the processing units and the exhaust chamber, are stacked.

8. The apparatus of claim 1, wherein the semiconductor manufacturing apparatus is installed in a clean room, and the atmosphere in the transferring passage is set under a positive pressure compared with the clean room.

9. The apparatus of claim 1, wherein the suction exhaust line is provided with a unit for performing a forced exhaust.

10. A semiconductor manufacturing method using a semiconductor manufacturing apparatus including a transfer mechanism having a moving part for holding a substrate and moving along a longitudinal transferring passage and a plurality of processing units disposed along the transferring passage to perform respective processes on the substrate, the method comprising the steps of:
    transferring the substrate between the transfer mechanism and any one of the plurality of processing units; and
    suction-exhausting an inner space of an exhaust chamber disposed under the processing units, the exhaust chamber having a gas exhaust opening formed at the side of the transferring passage, while guiding the moving part in the longitudinal direction along a guide member provided in the exhaust chamber or at a position facing the exhaust opening.

11. The method of claim 10, further comprising the step of injecting a gas from a gas injection unit provided at an upper portion of the transferring passage, wherein the gas flows into the exhaust opening via the transferring passage.

12. The method of claim 10, wherein a driving unit provided inside the exhaust chamber guides the moving part along the guide member in the longitudinal direction.

13. The method of claim 10, wherein the semiconductor manufacturing apparatus is installed in a clean room and the inner space of the exhaust chamber is suction-exhausted by using a forced exhausting unit so that the atmosphere in the transferring passage is maintained under a positive pressure compared with the clean room.

* * * * *